United States Patent [19]
Prince et al.

[11] Patent Number: 5,877,545
[45] Date of Patent: Mar. 2, 1999

[54] ENCAPSULATED PRINTED CIRCUIT ASSEMBLY AND METHOD AND MANUFACTURING THE SAME

[75] Inventors: David G. Prince, Gilmanton I.W.; Daniel D. Principe, Merrimack, both of N.H.

[73] Assignee: Cummins Engine Company, Inc., Columbus, Ind.

[21] Appl. No.: 822,428

[22] Filed: Mar. 21, 1997

[51] Int. Cl.$^6$ .................................................. H01L 23/02
[52] U.S. Cl. ........................ 257/679; 257/787; 361/737
[58] Field of Search .................................. 257/787, 678, 257/679; 361/737

[56] References Cited

U.S. PATENT DOCUMENTS

| | | |
|---|---|---|
| 5,067,008 | 11/1991 | Yanaka et al. |
| 5,079,673 | 1/1992 | Kodai et al. |
| 5,173,840 | 12/1992 | Kodai et al. |
| 5,244,840 | 9/1993 | Kodai et al. |
| 5,515,595 | 5/1996 | Kurz |
| 5,525,644 | 6/1996 | Artus et al. |
| 5,548,485 | 8/1996 | Bethurum et al. |
| 5,554,821 | 9/1996 | Patterson et al. |
| 5,617,297 | 4/1997 | Lo et al. ................................. 257/787 |

*Primary Examiner*—Peter Toby Brown
*Assistant Examiner*—Roy Potter
*Attorney, Agent, or Firm*—Woodard, Emhardt, Naughton Moriarty & McNett

[57] ABSTRACT

A PCMCIA card for use in electronic equipment includes a glass laminate circuit board including a pair of substantially planar, oppositely disposed component-mounting surfaces. Printed circuitry is designed and arranged on at least one of the component-mounting surfaces. At least one integrated circuit package is assembled onto the printed circuitry and has a length dimension direction and a shorter, width dimension direction. In order to reduce the stresses which the integrated circuit package is subjected to during handling of the PCMCIA card, the integrated circuit package is arranged on the circuit board such that the integrated circuit package length dimension direction is substantially parallel to the width dimension direction of a cooperating metal case which is part of the PCMCIA card. The assembled circuit board is encapsulated with a flexible potting compound and enclosed within the metal case to complete the PCMCIA card assembly. In order to further reduce the loading on the integrated circuit component and circuitry, the circuit board thickness does not exceed 0.79 mm ($\frac{1}{32}$ inch). The circuit board may be fabricated from a flexible polymer based flex circuit material to further reduce any loading.

6 Claims, 2 Drawing Sheets

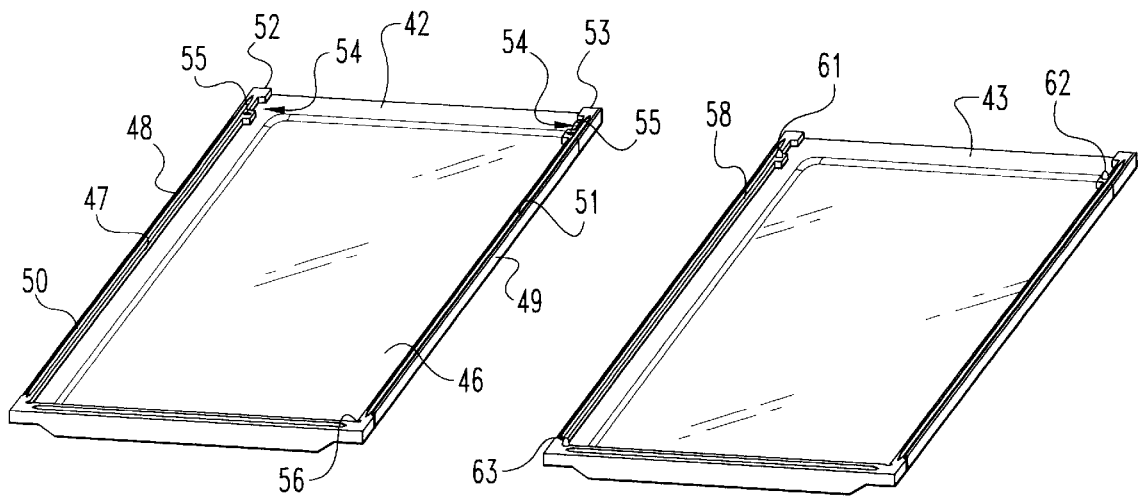
Fig. 5
Fig. 6
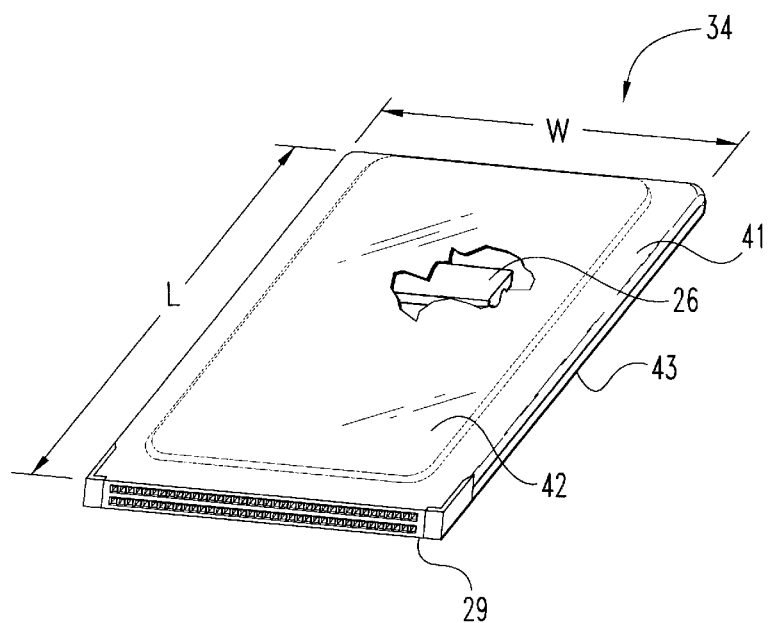
Fig. 7

ENCAPSULATED PRINTED CIRCUIT ASSEMBLY AND METHOD AND MANUFACTURING THE SAME

BACKGROUND OF THE INVENTION

The present invention relates generally to the design of electronic circuit assemblies which may be subjected to compression and/or bending stresses transmitted through their enclosures, the encapsulating of such circuit assemblies, and the component (integrated circuit and other fragile components) layout and arrangement. More specifically the present invention relates to the design of a PCMCIA card and the use of a flexible potting material for encapsulating the internal PCMCIA circuit assembly. The selected potting material maintains its resilient and flexible characteristics over a wide temperature range. The acronym PCMCIA stands for Personal Computer Memory Card International Association. A related feature of the present invention is the manner in which the integrated circuits and other components are arranged in the PCMCIA card in order to reduce the risk of damage due to the unique environment and stresses to which PCMCIA cards are exposed. A further feature of the present invention is the use of a thinner base board or flexible polymer based media in order to reduce the force which the board transmits to the electronic components which are mounted on the board.

Printed circuit boards are typically constructed from a glass laminate board which is clad with a conductive layer for the creation of a printed circuit. By means of a photo-resist coating and photographic art work, a circuit layout is created. The portions of the conductive layer which are not part of the designed circuit are etched off the glass laminate surface. The component leads may either be soldered directly to the surface of circuit pads or with larger components holes may be drilled through the circuit pads in order to receive the component leads. Flexible circuits are typically constructed on a polymer based film. The circuit traces and pad images are reverse imaged on a fine screen using photo resist and photographic artwork. These traces and pads are printed onto the polymer film using conductive silver ink or anisotropic adhesive and standard screen printing techniques, with different patterns on opposite sides of the film. Connections between sides are made by punching holes in the film and "printing" through the holes.

One type of component which has widespread use on circuit boards of the type disclosed herein is an integrated circuit or IC which includes a generally rectangular solid body with a series of leads exiting on opposite sides of the encapsulated IC body. These components are designed in such a way that their leads are to be soldered directly onto the surface of circuit pads which are provided as part of the circuit art work.

PCMCIA cards are widely used in computers and in computerized equipment for a number of functions, including data storage, data transfer, and for various I/O devices such as modems and GPS receivers. PCMCIA cards have a standardized package size and shape as well as a standardized interface. Most PCMCIA cards produced today enclose the circuit assembly in a thin walled metal case which provides limited protection for the internal assembly.

While most PCMCIA cards work reliably indoors, in passenger transport vehicles, and even in the field if the user is careful, PCMCIA cards tend to fail when they are stressed beyond the applicable PCMCIA specifications for shock, vibration, compression, twisting, and bending. Bending with both ends supported and a load applied near the center of the PCMCIA card appears to be particularly destructive. This specific type of loading can occur and frequently does occur when the user places the PCMCIA card in his or her rear pocket and then sits down. While careful handling of the PCMCIA cards would presumably preclude such load damage, PCMCIA cards are not always handled with the requisite care and thus the need for the present invention. The present invention significantly increases the reliability of PCMCIA cards in these types of environments where the PCMCIA cards are likely to be stressed beyond their design limits.

Typical failures to circuit assemblies when the design stress is exceeded include cracked or broken components, as well as cracked or broken solder joints or circuit traces. In view of the restricted space which is available for PCMCIA cards, most of these assemblies use relatively thin components which are surface mounted. The memory ICs which are used are typically in TSOP packages. These packages are typically plastic and measure approximately 17.78 mm (0.7 inches) in length, 7.62 mm (0.3 inches) to 12.7 mm (0.5 inches) in width, and 1.19 mm (0.047 inches) in thickness. There are a series of gull wing leads on opposite sides of the package. When a load is exerted on these ICs in a direction normal to the surface of the PCMCIA board, the IC package may crack or the solder joints of the leads to the circuit pads may break. If there is a load applied to the board beneath the IC package, such as bending the PCMCIA card along its length, this may force the board into a convex arc beneath the IC package which can either crack the package, break the solder connection of the leads to the circuit pads, or both.

It would be an improvement to the design of PCMCIA cards if their reliability could be increased or otherwise improved in these harsh environments. One approach to improve the reliability of such PCMCIA cards as provided by the present invention is to use a flexible potting material which encapsulates the components which are mounted onto the circuit board. Another improvement provided by the present invention is to orient the long axis of the components parallel with the width (short axis) of the case and transverse to the long axis of the case. A still further feature of the present invention is the use of a thinner glass laminate board or flexible printed circuit media in order to reduce the force which the board is able to transmit to a component mounted on the board when the board is flexed.

Although there have been a variety of PCMCIA circuit board and IC packaging concepts patented over the years, none of these earlier designs anticipate nor render obvious the combination of features of the present invention. The following listed patents are believed to provide a representative sampling of these earlier PCMCIA circuit board and IC packaging concepts:

| PATENT NO. | PATENTEE | ISSUE DATE |
| --- | --- | --- |
| 5,067,008 | Yanaka et al. | Nov. 19, 1991 |
| 5,079,673 | Kodai et al. | Jan. 7, 1992 |
| 5,173,840 | Kodai et al. | Dec. 22, 1992 |
| 5,244,840 | Kodai et al. | Sep. 14, 1993 |
| 5,515,595 | Kurz | May 14, 1996 |
| 5,525,644 | Artus et al. | Jun. 11, 1996 |
| 5,548,485 | Bethurum et al. | Aug. 20, 1996 |
| 5,554,821 | Patterson et al. | Sep. 10, 1996 |

Based upon the disclosures of the listed patents, the packaging of ICs and the layout and arrangement of PCMCIA circuit boards has received a substantial degree of design attention over the years. However, the improvements offered by the present invention for the specific purpose of improving PCMCIA card reliability have not heretofore been the focus of any earlier inventions. The phrase "environmentally hardened" can be used to describe the PCMCIA card of the present invention in that the PCMCIA card is modified or enhanced in some way to be able to survive in a harsh environment.

SUMMARY OF THE INVENTION

A PCMCIA card for use in electronic equipment according to one embodiment of the present invention comprises a circuit assembly which is enclosed within a case, the case being defined by a length dimension direction and a shorter, width dimension direction, the circuit assembly including a circuit board having a pair of substantially planar and oppositely disposed component-mounting surfaces, printed circuitry positioned on at least one of the component-mounting surfaces, and at least one integrated circuit package mounted onto the circuit board, the integrated circuit package having a length dimension direction and a shorter, width dimension direction and being oriented on the circuit board such that the integrated circuit package length dimension direction is substantially parallel to the width dimension direction of the case.

One object of the present invention is to provide an improved PCMCIA card. A related object of the present invention is to provide an improved method for fabricating a PCMCIA card.

Related objects and advantages of the present invention will be apparent from the following description.

BRIEF DESCRIPTION OF THE DRAWINGS

FIG. 5 is a perspective view of one portion of an enclosing case for the FIG. 3 encapsulated circuit board assembly.

FIG. 6 is a perspective view of another portion of the enclosing case according to the present invention.

FIG. 7 is a perspective view of the FIG. 5 and FIG. 6 enclosing case portions arranged in an enclosing manner around the FIG. 3 encapsulated circuit board assembly so as to create a PCMCIA card.

DESCRIPTION OF THE PREFERRED EMBODIMENT

Figure 1:
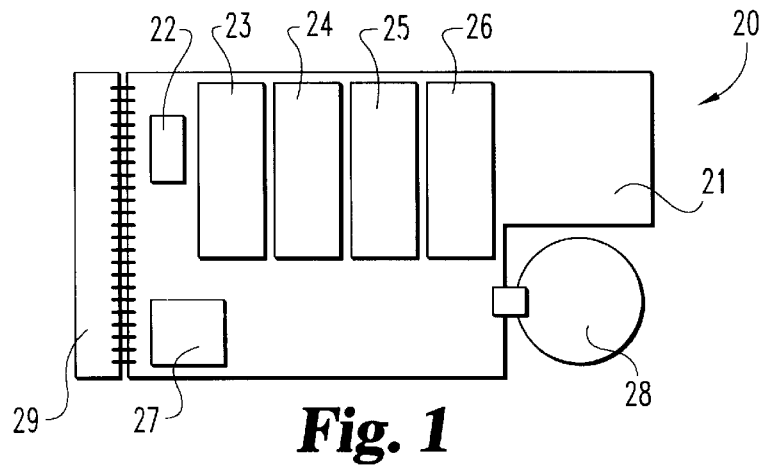
FIG. 1 is a top plan view of a circuit board assembly for a PCMCIA card according to the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 2:
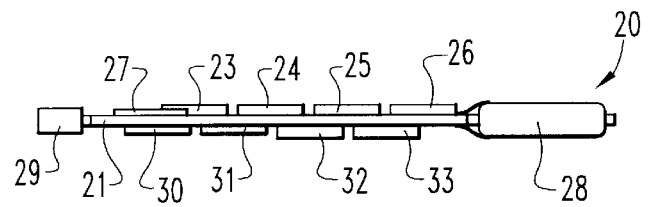
FIG. 2 is a side elevational view of the FIG. 1 circuit board assembly.

Referring to FIGS. 1 and 2, a circuit board assembly which has been designed according to the present invention is illustrated. The circuit board assembly 20 includes a base circuit board 21, a plurality of electronic components 22–27, battery 28, and connector strip 29. Additional electronic components 30–33 are mounted on the opposite side of the board 21. Circuit board assembly 20, including connector strip 29, is part of a PCMCIA card 34 (see FIG. 7) requiring encapsulation and the enclosing metal case 41 (see FIGS. 5 and 6) for completing the PCMCIA card 34.

Board 21 is fabricated out of a copper-clad, glass laminate material and is double sided. The designed circuit layouts for each side of the board are etched onto the sides of the board and the various components are then soldered in place. The leads of the various components are surface mounted onto circuit pads and soldered in place. Assembly 20 is intended to represent the circuitry for one type of PCMCIA card which would be widely used in computers and computerized equipment. The specific assembly which is illustrated is a memory card and accordingly battery 28 provides the necessary back up power. Assembly 20 is encapsulated and then enclosed in a protective metal case 41 as illustrated in FIGS. 5–7, and the case is ultrasonically welded shut in order to complete the fabrication of PCMCIA card 34.

The concerns which are addressed by the present invention as discussed in the Background relate to the handling of a PCMCIA card, the environment to which a PCMCIA card is exposed, and the nature of the forces to which the components that are mounted on the circuit board are subjected. Whenever the PCMCIA card is handled in such a way so as to bend or flex the case 41, forces are transmitted to the electronic components and to the circuit board 21. In the case of thin, surface mounted components in TSOP packages, such as memory integrated circuits (ICs), these forces can crack the package or break the solder joints of the gull wing leads from the copper clad circuitry of the board. As would be understood, bending of the PCMCIA card along its length creates a convex arc shape on one side of the circuit board 21 and a concave arc shape on the opposite side of the circuit board. There are accordingly tension forces on the convex side and compression forces on the concave side. In addition to the possibility of cracking the plastic package of the ICs, the soldered leads can pop free from the copper clad circuitry. Additionally, it is possible for the copper clad circuitry to actually lift off of the glass laminate board. The direct tension and compression forces can crack or break the copper circuit traces.

In order to address the potential problems outlined above, the present invention introduces three specific improvements. The first improvement is the use of a glass laminate board which has a thickness which is 0.79 mm (1/32 inch) or less. While the common or typical PCMCIA circuit board thicknesses are in the range of 1.19 mm (3/64 inch) to 0.79 mm (1/32 inch), changing to a thinner glass laminate material or the polymer film based "flex circuit" for board 21 reduces the force the board is able to transmit to the electronic components which are mounted on the board during bending and/or twisting of the PCMCIA card. Going to a thinner material for board 21 also reduces the stress on the circuit traces on the board because the surfaces of the board are closer to the centerline of the board. There are less or lower tension and compressive forces on the board surfaces due to the thinner board and thus the forces which the circuit traces and electronic components see are less or lower.

The second improvement provided by the present invention is the layout arrangement for the electronic components. The memory ICs represented by component 23–26 and 30–32 are approximately 18.39 mm (0.724 inches) in length and from 8.0 mm (0.315 inches) to 11.99 mm (0.472 inches) in width. Accordingly there is clearly a length dimension and a length dimension direction as well as a shorter width dimension and corresponding width dimension direction. The case 41 of the PCMCIA card 34 (see FIG. 7), also has a length dimension (L) and a corresponding length dimension direction. Further, the case 41 of the PCMCIA card 34 has a shorter width dimension (W) and a corresponding width dimension direction. By orienting the length dimension of each IC parallel to the shorter width dimension of the case for the PCMCIA card, the board deflection spanned by the IC during bending of the board is reduced. The reduced board deflection spanned by the IC reduces the stress on the IC component. It will be noted that the PCMCIA card is more rigid along its shorter width dimension (W) as compared to its length dimension (L) and that the PCMCIA card is less likely to be bent or flexed along the shorter width dimension.

Figure 3:
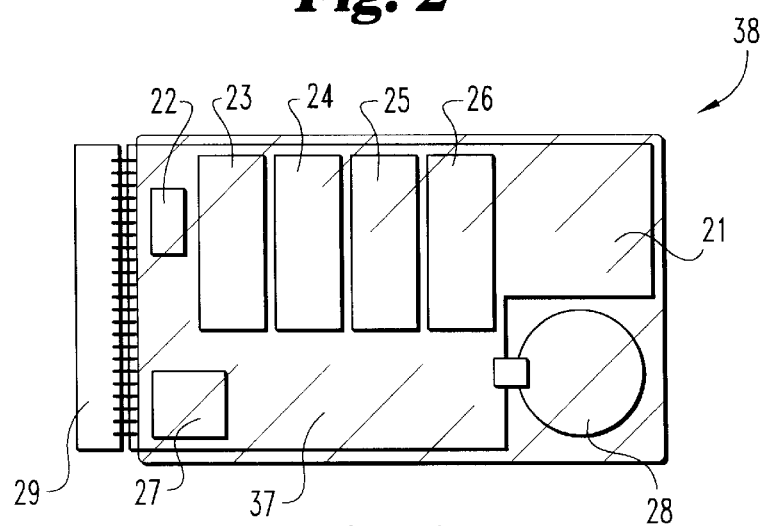
FIG. 3 is a top plan view of the FIG. 1 circuit board assembly as encapsulated.
Figure 4:
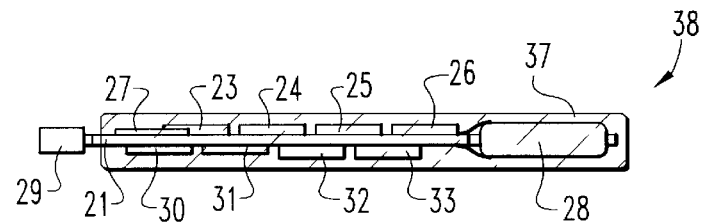
FIG. 4 is a side elevational view of the FIG. 3 encapsulated circuit board assembly.

Referring to FIGS. 3 and 4, another improvement provided by the present invention is illustrated. In FIGS. 3 and 4 the assembly 20 of FIGS. 1 and 2 is now encapsulated in a flexible potting compound 37. The assembly 38 which is created as a result of the encapsulating step centers the assembly 20 in a precise volume of potting compound (see FIG. 4) in order to distribute external forces and pressures. By distributing the various forces, pressures and the stress across the entire surface of the assembly, the force loading on any individual component or IC is reduced. The use of a flexible potting compound 37 which is sandwiched and enclosed by the outer metal case of FIGS. 5 and 6 distributes compression and tension forces, as well as shock and vibration as seen by individual components without adversely affecting the performance of the assembly 38. The selected potting compound 37 is a flexible material which maintains its flexibility over a wide temperature range. The selected potting compound 37 has a relatively low moisture absorption coefficient and thereby creates an effective moisture seal for the electronics mounted onto circuit board 21. The potting compound 37 may be precision molded onto assembly 20 or poured around assembly 20 once the assembly is placed inside the enclosing case (i.e., potted), see FIGS. 5 and 6. A suitable material for potting compound 37 is General Electric GE RTV615A silicone rubber material.

Referring now to FIGS. 5, 6, and 7, the enclosing metal case 41 for the encapsulated assembly 38 is illustrated. The addition of case 41 to assembly 38 completes the fabrication of the PCMCIA card 34. The top panel 42 of case 41 is illustrated in FIG. 5, the bottom panel 43 is illustrated in FIG. 6, and the assembled case 41 is illustrated in FIG. 7. In FIG. 5, a formed metal panel 46 is adhesively bonded to a three-sided plastic edge strip 47. The opposite sides 48 and 49 of panel 46 are formed up along the opposite sides 50 and 51 of the plastic edge strip 47. The free ends 52 and 53 of the plastic edge strip are each arranged with a corresponding notch relief 54 for the positioning and placement of the connector strip 29. The free ends 52 and 53 also each include a corresponding receiving hole 55. A third receiving hole 56 is located in corner 57.

With reference to FIG. 6, panel 43 is virtually the same as panel 42 with one exception. The three-side plastic edge strip 58 of panel 43 includes three small plastic pegs 61, 62, and 63 in lieu of the receiving holes 55 and 56. The locations of the three plastic pegs coincide with the locations of the three holes and the pegs are sized so that they fit closely within the corresponding holes as the two panels 42 and 43 are sandwiched together around the encapsulated PC card 38. While a type of snap-fit for the two panels is an option, the sides of the panels where the plastic strips are positioned are ultrasonically welded together so as to actually fuse the two plastic strips to each other. The fourth side where the connector 29 is located is sealed by adhesive. The result is a securely encased and protected PCMCIA card which is thin, light weight, and compact.

The fabrication of the encapsulated assembly 38 begins with the determination of the board size and the circuit design or layout. While either one may dictate the other, depending on the situation, with PCMCIA cards there is typically a standard size to be maintained. What can be provided as far as circuitry and components is thus controlled in this situation by the starting and standard board size.

The next step is to select the required components needed for the particular circuit and design the actual circuit layout to accept those components consistent with the electrical schematic. Once the circuit pads and traces are etched onto the board, the components are assembled, including the assembly of connector 29. The individual component leads are soldered onto the circuit pads and any other wiring is completed. The next step would typically be inspection of the completed assembly 20 and an electrical check out to be sure that everything performs in a satisfactory manner. These steps should be performed prior to encapsulating the PC board so that any corrections can be made or components replaced without having to cut away the encapsulating material. Once the circuitry and components are checked and any initial burn in is conducted, the assembly 20 is encapsulated with potting compound 37. Since the case 41 which encloses the encapsulated assembly 38 has a defined size, it is important that some type of potting fixture be used in order to control the size and shape of the encapsulated assembly 38. A variety of potting fixtures can be used for this purpose, including use of one panel of case 41 as part of the mold or fixture. Once the potting compound has cured, and assuming that it has resulted in an encapsulated assembly of the required size and shape, the encapsulated assembly 38 is then assembled into case 41, noting that if one of the two panels of case 41 has been used as part of the mold fixture, the encapsulated assembly will already be partially assembled. The assembly procedure is completed by placing the top panel 42 and the bottom panel 43 on opposite sides of the encapsulated assembly 38. These two panels are then held together while the abutting plastic edge strips 47 and 58 are ultrasonically welded together. This completes the fabrication of PCMCIA card 34.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A PCMCIA card for use in electronic equipment, said PCMCIA card comprising:
   a circuit board including a pair of substantially planar, oppositely disposed component-mounting surfaces;
   printed circuitry positioned on at least one of said component-mounting surfaces;
   at least one integrated circuit package mounted onto said circuit board so as to create a circuit board assembly, said integrated circuit package having a length dimension direction and a shorter, width dimension direction;
   a flexible potting compound applied to said circuit board assembly; and
   an enclosing case constructed and arranged to receive said circuit board assembly with said flexible potting compound applied, said case being defined by a length dimension direction and a shorter, width dimension direction, wherein said integrated circuit package being oriented on said circuit board such that said integrated circuit package length dimension direction is substantially parallel to the width dimension direction of said enclosing case.

2. The PCMCIA card of claim 1 wherein said circuit board has a board thickness which does not exceed 0.79 mm (1/32 of an inch).

3. The PCMCIA card of claim 1 wherein said circuit board is fabricated from a flexible polymer based flex circuit material.

4. A PCMCIA card for use in electronic equipment, said PCMCIA card comprising:

a circuit board having a pair of substantially planar, oppositely disposed component-mounting surfaces;

printed circuitry positioned on at least one of said component-mounting surfaces;

at least one integrated circuit component mounted onto said printed circuitry;

a flexible potting compound applied over said integrated circuit component and onto said printed circuitry; and an enclosing case having a length dimension direction and a shorter, width dimension direction and wherein said integrated circuit component has a length dimension direction and said integrated circuit component being arranged on said printed circuitry such that the length dimension direction of said integrated circuit component is substantially parallel with the width dimension direction of said enclosing case.

5. The PCMCIA card of claim 4 wherein said circuit board has a board thickness which does not exceed 1/32 of an inch.

6. The PCMCIA card of claim 4 wherein said circuit board is fabricated from a flexible polymer based flex circuit material.

* * * * *